United States Patent
Yamashita

(10) Patent No.: US 8,407,532 B2
(45) Date of Patent: Mar. 26, 2013

(54) TEST APPARATUS AND TRANSMISSION DEVICE

(75) Inventor: Hironaga Yamashita, Saitama (JP)

(73) Assignee: Advantest Corporation, Tokyo (JP)

( * ) Notice: Subject to any disclaimer, the term of this patent is extended or adjusted under 35 U.S.C. 154(b) by 194 days.

(21) Appl. No.: 12/942,912

(22) Filed: Nov. 9, 2010

(65) Prior Publication Data

US 2011/0087931 A1 Apr. 14, 2011

Related U.S. Application Data

(63) Continuation of application No. PCT/JP2008/062864, filed on Jul. 16, 2008.

(60) Provisional application No. 61/057,205, filed on May 30, 2008.

(51) Int. Cl.
*G06K 5/04* (2006.01)
*H03M 13/00* (2006.01)

(52) U.S. Cl. ...................... 714/699; 714/776

(58) Field of Classification Search ............. 714/699, 714/712, 746, 751, 752, 799, 776, 703, 742, 714/710
See application file for complete search history.

(56) References Cited

U.S. PATENT DOCUMENTS

| | | | |
|---|---|---|---|
| 6,345,375 B1 * | 2/2002 | Kelkar et al. | 714/748 |
| 7,082,488 B2 * | 7/2006 | Larson et al. | 710/301 |
| 7,320,100 B2 * | 1/2008 | Dixon et al. | 714/758 |
| 7,340,364 B1 | 3/2008 | Kumaki | |
| 7,502,708 B2 * | 3/2009 | Kumaki | 702/123 |
| 7,565,593 B2 * | 7/2009 | Dixon et al. | 714/754 |
| 7,676,728 B2 * | 3/2010 | Resnick et al. | 714/764 |
| 8,024,636 B2 * | 9/2011 | Laprade et al. | 714/755 |
| 2004/0267999 A1 | 12/2004 | Larson et al. | |
| 2008/0091377 A1 | 4/2008 | Kumaki | |
| 2010/0027679 A1 * | 2/2010 | Sunahara et al. | 375/240.24 |
| 2011/0047431 A1 * | 2/2011 | Owaki et al. | 714/748 |

FOREIGN PATENT DOCUMENTS

| | | | |
|---|---|---|---|
| JP | S56-168251 A | | 12/1981 |
| JP | S62-186632 A | | 8/1987 |
| JP | 3-136537 A | | 6/1991 |
| JP | 4-98443 A | | 3/1992 |
| JP | H4-180425 A | | 6/1992 |
| JP | H11-252184 A | | 9/1999 |
| JP | 2003-69637 A | | 3/2003 |
| JP | 2005-4746 A | | 1/2005 |
| WO | 2008/044421 A1 | | 4/2008 |

OTHER PUBLICATIONS

International Search Report (ISR) issued in PCT/JP2008/062864 (parent application) mailed in Oct. 2008 for Examiner consideration.
Written Opinion (PCT/ISA/237) issued in PCT/JP2008/062864 (parent application) mailed in Oct. 2008.
Applicants bring the attention of the Examiner to the following pending U.S. Appl. No. 12/942,917, filed Nov. 9, 2010 and U.S. Appl. No. 12/943,815, filed Nov. 10, 2010.

(Continued)

*Primary Examiner* — Phung M Chung

(57) ABSTRACT

Provided is a test apparatus that tests a device under test, comprising a test unit that sends and receives signals to and from the device under test; and a control apparatus that controls the test unit. The control apparatus includes a first buffer and a second buffer that buffer access requests to the test unit; a data output section that buffers, in the first buffer, access requests to be sent from the control apparatus to the test unit and, when an error occurs, buffers the access requests in the second buffer instead of the first buffer; and a transmitting section that sequentially transmits the access requests in the first buffer to the test unit and, when an error occurs, sequentially transmits the access requests in the second buffer to the test unit.

7 Claims, 3 Drawing Sheets

OTHER PUBLICATIONS

International Search Report (ISR) issued in PCT/JP2008/065458 (related application) mailed in Nov. 2008 for Examiner consideration.

Written Opinion (PCT/ISA/237) issued in PCT/JP2008/065458 (related application) mailed in Nov. 2008.

International Search Report (ISR) issued in PCT/JP2008/065456 (related application) mailed in Nov. 2008 for Examiner consideration.

Written Opinion (PCT/ISA/237) issued in PCT/JP2008/065456 (related application) mailed in Nov. 2008.

Japanese Office Action dated Mar. 29, 2011, in a counterpart Japanese patent application JP2010-514323.

Korean Office Action dated May 27, 2012, in a counterpart Korean patent application No. 10-2010-7025470.

* cited by examiner

TEST APPARATUS AND TRANSMISSION DEVICE

BACKGROUND

1. Technical Field

The present invention relates to a test apparatus and a transmission device. In particular, the present invention relates to a test apparatus that tests a device under test and a transmission device that transmits access requests to a receiving device.

2. Related Art

A system is known that transmits access requests in packets from a transmission device to a receiving device. A test system that tests a device under test, for example, also transmits access requests in packets from a control apparatus to a test unit.

In such a system, however, when a portion of the packets become stuck in the transmission path, the access requests cannot be transmitted from the transmission device to the receiving device. In this case, the entire system must be reset, which takes a long time. Also, in this case, downstream stages cannot be accessed from the receiving device side, and therefore it is difficult to analyze the location where the packets are stuck and the cause of the packets being stuck.

SUMMARY

Therefore, it is an object of an aspect of the innovations herein to provide a test apparatus and a transmission device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a test apparatus that tests a device under test, comprising a test unit that sends and receives signals to and from the device under test; and a control apparatus that controls the test unit. The control apparatus includes a first buffer and a second buffer that buffer access requests to the test unit; a data output section that buffers, in the first buffer, access requests to be sent from the control apparatus to the test unit and, when an error occurs, buffers the access requests in the second buffer instead of the first buffer; and a transmitting section that sequentially transmits the access requests in the first buffer to the test unit and, when an error occurs, sequentially transmits the access requests in the second buffer to the test unit.

According to a second aspect related to the innovations herein, provided is a transmission device comprising a first buffer and a second buffer that buffer access requests to a receiving device; a data output section that buffers, in the first buffer, access requests to be sent to the receiving device and, when an error occurs, buffers the access requests in the second buffer instead of the first buffer; and a transmitting section that sequentially transmits the access requests in the first buffer to the receiving device and, when an error occurs, sequentially transmits the access requests in the second buffer to the receiving device.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
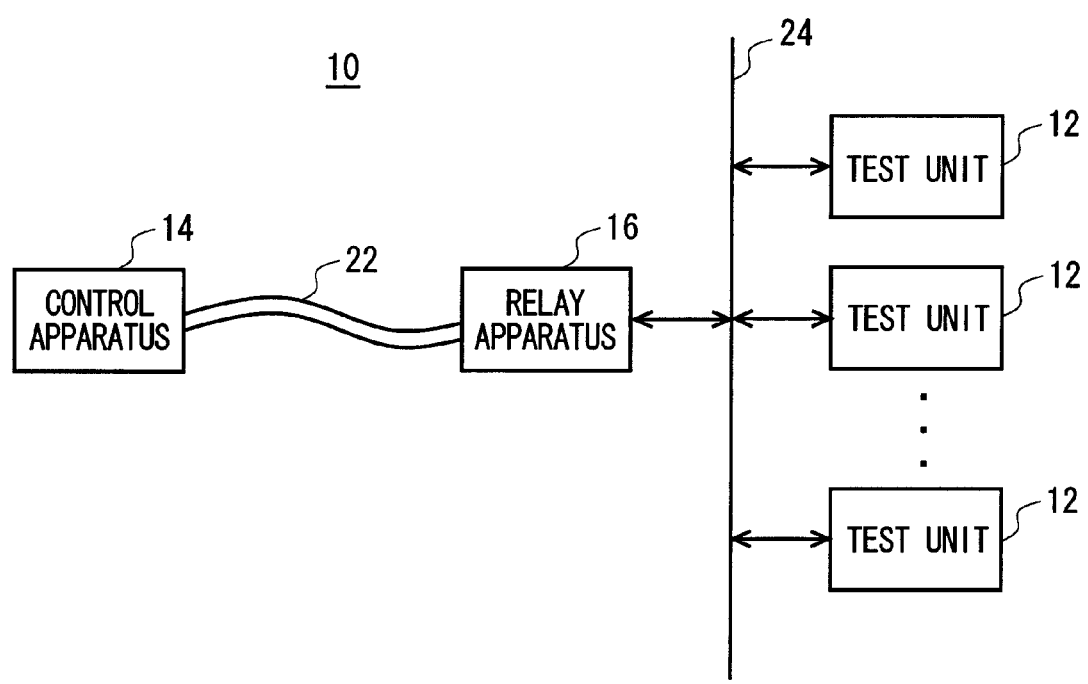
FIG. 1 shows a configuration of a test apparatus 10 according to an embodiment of the present invention.

FIG. 1 shows a configuration of a test apparatus 10 according to an embodiment of the present invention. The test apparatus 10 tests a device under test, such as a semiconductor device. The test apparatus 10 includes one or more test units 12, a control apparatus 14, and a relay apparatus 16.

Each test unit 12 sends and receives signals to and from the device under test. For example, each test unit 12 may supply the device under test with a test signal having a waveform corresponding to a test pattern, and judge acceptability of the device under test by comparing a response signal from the device under test to a logic value corresponding to an expected value pattern.

The control apparatus 14 accesses each of the one or more test units 12 to control the test units 12. The control apparatus 14 may be realized as a computer that functions as the control apparatus 14 by executing a program.

The relay apparatus 16 relays access requests and responses that are transmitted between the control apparatus 14 and the one or more test units 12. A transmission line 22, for example, which has a length of several meters, may be connected between the relay apparatus 16 and the control apparatus 14 to transmit serial data. A tester bus 24 may be connected between the test units 12 and the relay apparatus 16 to transmit parallel data.

Figure 2:
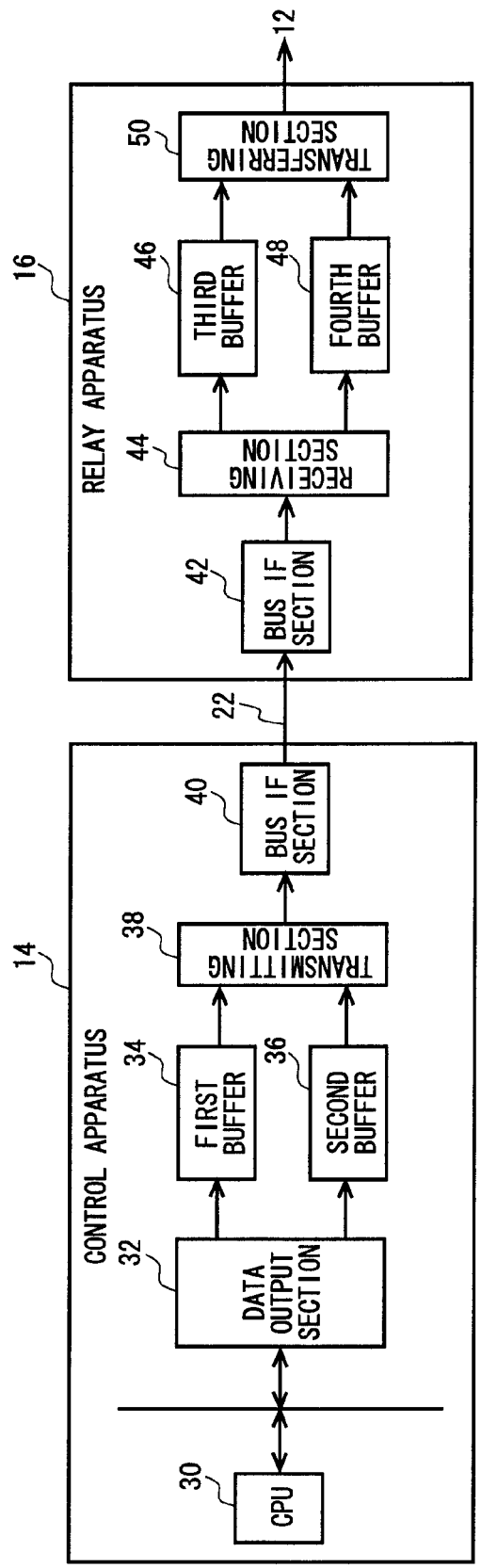
FIG. 2 shows configurations of the control apparatus 14 and the relay apparatus 16 according to an embodiment of the present invention.

FIG. 2 shows configurations of the control apparatus 14 and the relay apparatus 16 according to the present embodiment. The control apparatus 14 includes a CPU 30, a data output section 32, a first buffer 34, a second buffer 36, a transmitting section 38, and a bus IF section 40. The CPU 30 executes a program to issue access requests to the test units 12.

The data output section 32 generates packets that include access requests to be transmitted from the control apparatus 14 to the test units 12, and buffers these packets in the first buffer 34 or the second buffer 36. The first buffer 34 and the second buffer 36 each buffer packets including access requests from the control apparatus 14 to the test units 12. The first buffer 34 and the second buffer 36 may each be a FIFO (First In First Out) buffer.

The transmitting section 38 sequentially transmits to the test units 12, via the relay apparatus 16, the packets that include the access requests in the first buffer 34 and the second buffer 36. The bus IF section 40 converts the data transmitted from the control apparatus 14 to the relay apparatus 16 via the transmission line 22, from a format that can be handled by the control apparatus 14 to a format that can be transmitted via the transmission line 22. For example, the bus IF section 40 may convert this data from a parallel format to a serial format.

The relay apparatus 16 includes a bus IF section 42, a receiving section 44, a third buffer 46, a fourth buffer 48, and a transferring section 50. The bus IF section 42 converts the data transmitted from the control apparatus 14 to the relay apparatus 16 via the transmission line 22, from a format that can be transmitted via the transmission line 22 to a format that can be handled by the relay apparatus 16. For example, the bus IF section 42 may convert this data from a serial format to a parallel format.

The receiving section 44 receives packets including access requests transmitted from the transmitting section 38 in the control apparatus 14. The receiving section 44 buffers the received packets in the third buffer 46 or the fourth buffer 48.

The third buffer 46 and the fourth buffer 48 each buffer packets including access requests transmitted from the control apparatus 14 to the test units 12. The third buffer 46 and the fourth buffer 48 may each be a FIFO buffer, for example. The transferring section 50 sequentially transmits, to the corresponding test unit 12, the packets including access requests in the third buffer 46 and the fourth buffer 48.

During normal operation, the control apparatus 14 and the relay apparatus 16 having the configurations described above operate as follows. First, the data output section 32 receives from the CPU 30 an access request to be transmitted from the control apparatus 14 to a test unit 12, and generates a normal operation packet that includes this access request. The data output section 32 then buffers the normal operation packet including the access request in the first buffer 34. The transmitting section 38 sequentially transmits, to the test units 12, the normal operation packets including access requests in the first buffer 34.

Furthermore, during normal operation, the receiving section 44 buffers normal operation packets including access requests received from the control apparatus 14 in the third buffer 46. The transferring section 50 sequentially transmits, to the corresponding test units 12, the normal operation packets including access requests in the third buffer 46.

When an error occurs, the control apparatus 14 and the relay apparatus 16 having the configurations described above operate as follows. First, the data output section 32 receives an access request to be transmitted from the control apparatus 14 to a test unit 12, and generates an error occurrence packet that includes this access request. The data output section 32 then buffers the error occurrence packet including the access request in the second buffer 36 instead of the first buffer 34. The transmitting section 38 sequentially transmits, to the test units 12, the error occurrence packets including access requests stored in the second buffer 36 instead of the first buffer 34.

Furthermore, when an error occurs, the receiving section 44 buffers the error occurrence packets including access requests received from the control apparatus 14 in the fourth buffer 48 instead of the third buffer 46. The transferring section 50 sequentially transmits, to the corresponding test units 12, the error occurrence packets including access requests in the fourth buffer 48 instead of in the third buffer 46.

The data output section 32 may judge that an error has occurred on a condition that packets have become stuck in any portion of the transmission path of the packets including access requests from the control apparatus 14 to the test units 12 during normal operation, i.e. the normally operating transmission path. For example, the data output section 32 may judge that an error has occurred on a condition that an access request written to the first buffer 34 has timed out, i.e. that an access request within the first buffer 34 has remained therein for a predetermined period.

The data output section 32 generates normal operation packets during normal operation and generates error occurrence packets when an error occurs. For example, the data output section 32 may generate packets that include in the headers thereof information indicating whether the packet is a normal operation packet or an error occurrence packet.

The transmitting section 38 may judge that an error has occurred on a condition that a packet is stored in the second buffer 36, and may then transmit the packets in the second buffer 36 instead of the packets in the first buffer 34 to the test units 12. As another example, the transmitting section 38 may judge whether an error has occurred by receiving a separate notification from the data output section 32 concerning whether an error has occurred.

The receiving section 44 may judge whether an error has occurred by analyzing identification information in the headers or the like of the packets received from the control apparatus 14. As another example, the receiving section 44 may judge whether an error has occurred by receiving a separate notification from the control apparatus 14 concerning whether an error has occurred.

The transferring section 50 may judge that an error has occurred when a packet is stored in the fourth buffer 48, and then transmits the packets in the fourth buffer 48 instead of the packets in the third buffer 46 to the test units 12. As another example, the transferring section 50 may judge whether an error has occurred by receiving a separate notification from the receiving, section 44 concerning whether an error has occurred.

Each block in which packets can become stuck during normal transmission may have a processing function to interpret requests in packets directed thereto and to execute processes corresponding to the interpreted requests. In this case, when an error occurs, the data output section 32 generates error occurrence packets including requests that make an inquiry to each of the blocks concerning whether packets are stuck therein, and buffers these error occurrence packages in the second buffer 36. Each block that receives one of the packets described above transmits to the data output section 32 a packet including a response indicating whether packets are stuck therein. As a result, the data output section 32 can identify the block in which packets are stuck in the transmission path.

When an error occurs, the data output section 32 generates error occurrence packets including requests for individually resetting each of the blocks, and stores these error occurrence packets in the second buffer 36. Each block that receives one of these error occurrence packets resets the transmission function therein. As a result, the data output section 32 can locally reset only the portions of the transmission path in which packets have become stuck during normal operation.

When an error occurs, the data output section 32 may reset at least a portion of the path in which packets including access requests are transmitted on a condition that an access request written in the second buffer 36 has timed out, i.e. that an access request in the second buffer 36 has remained therein for a predetermined period. For example, in this case, the data output section 32 may perform a process to reset all of the transmission paths that are used when an error occurs. As a result, when an error also occurs in a transmission path used when an error occurs, the test apparatus 10 can forcibly restore this transmission path.

The second buffer 36 may have fewer entries than the first buffer 34. In the same way, the fourth buffer 48 may have fewer entries than the third buffer 46. As a result, when an error occurs, the test apparatus 10 can transmit packets to a downstream stage without holding the packets in the buffers for a long time.

Even when an error occurs in the transmission path transmitting packets including access requests from the control apparatus 14 to the test unit 12 during normal operation, the test apparatus 10 described above can transmit packets including error occurrence access requests from the control apparatus 14 to the test units 12. As a result, the test apparatus 10 can avoid the error in the transmission path during normal operation and transmit independent access requests from the control apparatus 14 to the test units 12. Accordingly, when an error occurs, the test apparatus 10 can identify the block in which the error occurred and can locally reset only the portion in which the error occurred. As a result, the test apparatus 10 can fix the error without resetting the entire system.

Figure 3:
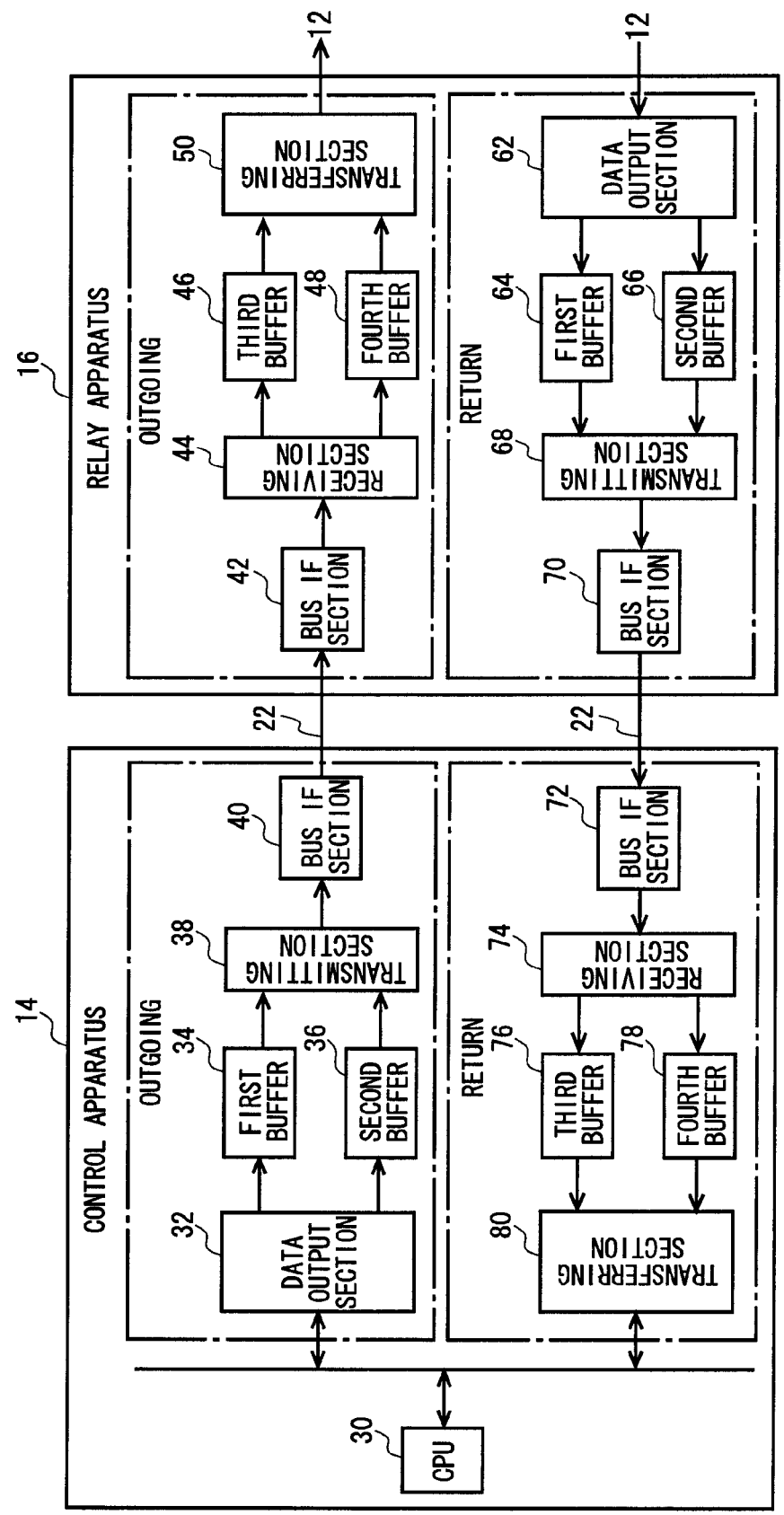
FIG. 3 shows configurations of the control apparatus 14 and the relay apparatus 16 according to a modification of an embodiment of the present invention.

FIG. 3 shows configurations of the control apparatus 14 and the relay apparatus 16 according to a modification of the present embodiment. The control apparatus 14 and the relay apparatus 16 shown in FIG. 3 adopt substantially the same function and configuration as the control apparatus 14 and the relay apparatus 16 shown in FIG. 2, and therefore components having substantially the same function and configuration as those shown in FIG. 2 are given the same reference numerals and only differing points are included in the following description.

The control apparatus 14 and the relay apparatus 16 each further include circuits on a return side in addition to circuits on an outgoing side. The circuits on the outgoing side in each of the control apparatus 14 and the relay apparatus 16 have the same configurations as shown in FIG. 2.

The relay apparatus 16 of the present modification includes, as circuits on the return side, a return path data output section 62, a return path first buffer 64, a return path second buffer 66, a return path transmitting section 68, and a bus IF section 70. During normal operation, the return path data output section 62 buffers normal operation packets including responses from the test units 12 in the return path first buffer 64. When an error occurs, the return path data output section 62 buffers error occurrence packets including responses from the test units 12 in the return path second buffer 66 instead of the return path first buffer 64. The other functions of the return path data output section 62 may be substantially the same as those of the data output section 32 in the control apparatus 14.

The return path first buffer 64 and the return path second buffer 66 each buffer packets including responses from the test units 12 to the control apparatus 14. The other functions of the return path first buffer 64 and the return path second buffer 66 may be respectively the same as those of the first buffer 34 and the second buffer 36 in the control apparatus 14.

During normal operation, the return path transmitting section 68 sequentially transmits the packets including responses in the return path first buffer 64 to the control apparatus 14. When an error occurs, the return path transmitting section 68 sequentially transmits the packets including responses in the return path second buffer 66 instead of the return path first buffer 64 to the control apparatus 14. The other functions of the return path transmitting section 68 may be the same as those of the transmitting section 38 in the control apparatus 14.

The bus IF section 70 converts the data transmitted from the relay apparatus 16 to the control apparatus 14 via the transmission line 22, from a format that can be handled by the relay apparatus 16 to a format that can be transmitted via the transmission line 22. For example, the bus IF section 70 may convert the data from a parallel format to a serial format.

The control apparatus 14 of the present modification includes, as the return side circuits, a bus IF section 72, a return path receiving section 74, a return path third buffer 76, a return path fourth buffer 78, and a return path transferring section 80. The bus IF section 72 converts data transmitted from the relay apparatus 16 to the control apparatus 14 via the transmission line 22, from a format that can be transmitted via the transmission line 22 to a format that can be handled by the control apparatus 14. For example, the bus IF section 72 may convert the data from a serial format to a parallel format.

The return path receiving section 74 transmits packets that include responses sent from the return path transmitting section 68 in the relay apparatus 16. During normal operation, the receiving section 44 buffers normal operation packets that include received responses in the return path third buffer 76. When an error occurs, the receiving section 44 buffers error occurrence packets that include the received responses in the return path fourth buffer 78 instead of the return path third buffer 76. Other functions of the return path receiving section 74 may be the same as those of the receiving section 44 in the relay apparatus 16.

The return path third buffer 76 and the return path fourth buffer 78 each buffer packets including responses from the test units 12 to the control apparatus 14. Other functions of the return path third buffer 76 and the return path fourth buffer 78 may be respectively the same as those of the third buffer 46 and the fourth buffer 48 in the relay apparatus 16.

During normal operation, the return path transferring section 80 sequentially transmits to the CPU 30 the normal operation packets including responses in the return path third buffer 76. When an error occurs, the return path transferring section 80 sequentially transmits to the CPU 30 the error occurrence packets including responses in the return path fourth buffer 78 instead of the return path third buffer 76. Other functions of the return path transferring section 80 may be the same as those of the transferring section 50 in the relay apparatus 16.

Even when an error occurs in the transmission transmitting packets including responses from the test unit 12 to the control apparatus 14 during normal operation, the test apparatus 10 can transmit packets including error occurrence responses from the test units 12 to the control apparatus 14. As a result, the test apparatus 10 can avoid the error in the transmission path during normal operation and transmit independent responses from the control apparatus 14 to the test units 12.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. For example, the invention is not limited to use in the test apparatus 10 and can be applied to common communication systems. In other words, the invention described via the above embodiments can be applied to a common communication system that transmits access requests from a transmission device to a receiving device or transmits responses from a receiving device to a transmission device.

What is claimed is:

1. A test apparatus that tests a device under test, comprising:
   - a test unit that sends and receives signals to and from the device under test; and
   - a control apparatus that controls the test unit, wherein the control apparatus includes:
   - a first buffer and a second buffer that buffer packets including access requests to the test unit;
   - a data output section that, (i) during normal operation, generates normal operation packets including identification information identifying that the packets are for normal operation, and buffers, in the first buffer, the normal operation packets to be sent from the control apparatus to the test unit and, (ii) when an error occurs, generates error occurrence packets including identification information identifying that the packets are for an error occurring situation, and buffers, in the second buffer, the error occurrence packets to be sent from the control apparatus to the test unit; and
   - a transmitting section that, during normal operation, sequentially transmits the normal operation packets in the first buffer to the test unit and, when an error occurs, sequentially transmits the error occurrence packets in the second buffer to the test unit.

2. The test apparatus according to claim 1, wherein the data output section judges that an error has occurred on a condition that a packet in the first buffer remains there for a predetermined period.

3. The test apparatus according to claim 1, further comprising a relay apparatus that relays between the control apparatus and the test unit, wherein the relay apparatus includes:
   - a third buffer and a fourth buffer that buffer packets including access requests to the test unit;
   - a receiving section that receives packets transmitted from the transmitting section, buffers the received packets in the third buffer during normal operation, and, when an error occurs, buffers the received packets in the fourth buffer; and
   - a transferring section that sequentially transmits the packets in the third buffer to the test unit during normal operation and, when an error occurs, sequentially transmits the packets in the fourth buffer to the test unit.

4. The test apparatus according to claim 1, further comprising a relay apparatus that relays between the control apparatus and the test unit, wherein the relay apparatus includes:
   - a return path first buffer and a return path second buffer that buffer responses from the test unit;
   - a return path data output section that buffers the responses from the test unit in the return path first buffer during normal operation and, when an error occurs, buffers the responses in the return path second buffer; and
   - a return path transmitting section that sequentially transmits the responses in the return path first buffer to the control apparatus during normal operation and, when an error occurs, sequentially transmits the responses in the return path second buffer to the control apparatus.

5. The test apparatus according to claim 1, wherein the data output section resets at least a portion of a path that transmits the packets when an error occurs, on a condition that a packet remains in the second buffer for a predetermined period.

6. The test apparatus according to claim 1, wherein the second buffer has fewer entries than the first buffer.

7. A transmission device comprising:
   - a first buffer and a second buffer that buffer packets including access requests to a receiving device;
   - a data output section that, (i) during normal operation, generates normal operation packets including identification information identifying that the packets are for normal operation, and buffers, in the first buffer, the normal operation packets to be sent to the receiving device and, (ii) when an error occurs, generates error occurrence packets including identification information identifying that the packets are for an error occurring situation, and buffers, in the second buffer, the error occurrence packets to be sent to the receiving device; and
   - a transmitting section that, during normal operation, sequentially transmits the normal operation packets in the first buffer to the receiving device and, when an error occurs, sequentially transmits the error occurrence packets in the second buffer to the receiving device.

* * * * *